Aug. 9, 1960 S. H. MERRILL ET AL 2,948,610
LIGHT-SENSITIVE COMPOSITIONS AND THEIR USE
IN PHOTOMECHANICAL PROCESSES
Filed July 29, 1955
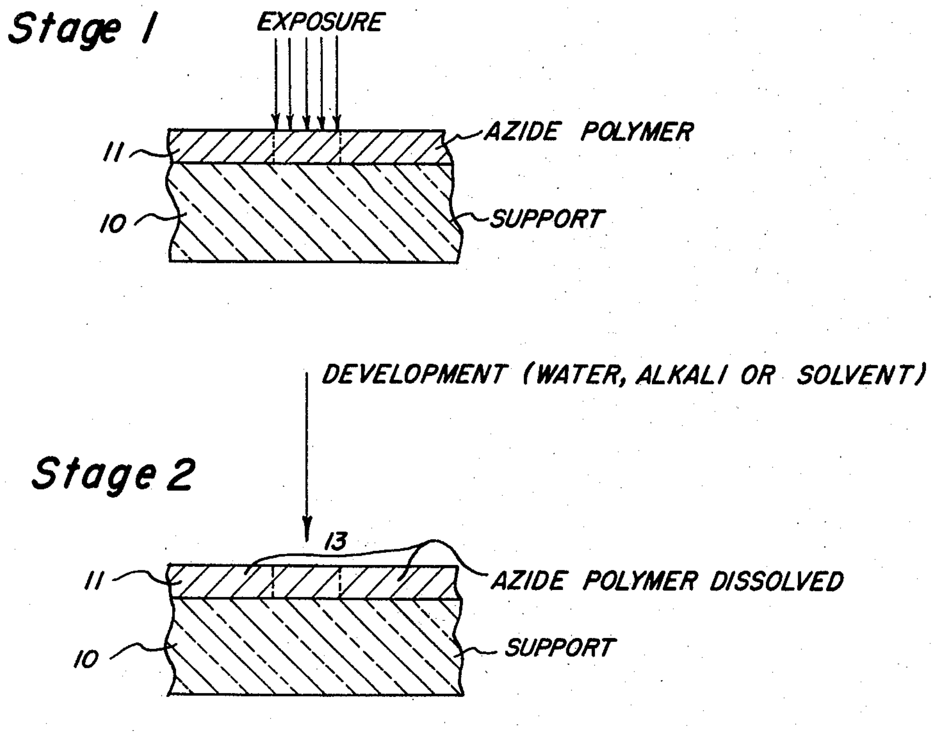
STEWART H. MERRILL
EARL M. ROBERTSON
HENRY C. STAEHLE
INVENTORS
BY Daniel J. Mayne
W. H. McDowell
ATTORNEY & AGENT 2,948,610

LIGHT-SENSITIVE COMPOSITIONS AND THEIR USE IN PHOTOMECHANICAL PROCESSES

Stewart H. Merrill, Earl M. Robertson, and Henry C. Staehle, Rochester, N.Y., assignors to Eastman Kodak Company, Rochester, N.Y., a corporation of New Jersey Filed July 29, 1955, Ser. No. 525,271

6 Claims. (Cl. 96—33)

This invention relates to light-sensitive polymers and their use in photomechanical processes.

Various polymeric materials have previously been proposed for use in photomechanical processes as in the preparation of printing plates. Some of these first efforts in the photomechanical art have included the use of coatings of high molecular weight organic colloids such as gelatin and albumin not inherently light-sensitive and to which it was necessary to add sensitizing agents such as bichromate to render the organic colloids capable of being insolubilized imagewise upon exposure to light. More recently, polymers have been described which possess inherent light sensitivity and without addition of a light-sensitizing agent, coatings of the polymers on a plate or other support can therefore be exposed imagewise to insolubilize the polymer after which the unexposed area of the polymer coating can be removed with organic solvent to leave a resist image on the support. The cinnamic acid esters of polyvinyl alcohol described in the Minsk et al. U.S. Patent 2,690,966 granted October 5, 1954, whose light sensitivity appears to be attributable to the presence in the polymer molecule of a substantial number of reactive cinnamoyl groups, are illustrative of such inherently light-sensitive polymers.

We have discovered that certain new polymeric materials are inherently light-sensitive and are capable of being coated on a support and locally insolubilized upon exposure to light. These polymers are azide polymers, that is, polymers which contain the azide group $—N_3$. This group is believed to have the resonant structures $$-\overset{(-)}{N}-\overset{(+)}{N}\equiv N \rightleftarrows -N=\overset{(+)}{N}=\overset{(-)}{N}$$

cf. Boyer and Canter, Chem. Rev., 54, 20(1954), and will be referred to as $—N_3$ hereinafter.

This azide group is attached by various linkages to the recurring units of the polymer chain. A particularly efficacious group of these azide polymers are the inherently light-sensitive alkali soluble azide polymers which upon exposure to light become insoluble in alkali. Therefore a process is made available in which a layer of the inherently light-sensitive alkali-soluble azide polymer in the acid form or the salt form can be locally insolubilized by exposure to light and the remaining unexposed polymer of the layer removed in the form of a water-soluble salt.

One object of our invention is to provide the azide polymers and light-sensitive compositions containing the azide polymers, such as are useful in photomechanical processes. Another object is to provide representative photomechanical processes for using the azide polymers. Other objects will appear from the following description of our invention.

As will be apparent from the description of the invention hereinafter, the azide polymers can be represented by various formulas. The polymers contain recurring polymeric units which can be represented simply as

in which U represents the recurring atoms of the polymer chain proper and Z is a linkage joining the azide group to the recurring atoms of the polymer chain for example the atoms and groups: $—CH_2—$, —CO—, phenylene, $$—C_6H_4—CH_2—O—CO—,\quad —C_6H_4—CO—O—,$$
$$—C_6H_4—O—,\quad —C_6H_3(COOH)—CO—O—,$$

and $—C_6H_4—O—C_2H_4—O—$. In copolymers, additional polymeric units $U_1$, $U_2$ etc., differing from U are present and the copolymers can therefore be represented as

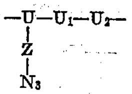

Polymers are also contemplated by the invention which contain recurring units of the structure

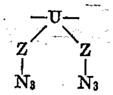

in which the Z's are the same or different linkages such as mentioned above as may be present for example in aryl azide derivatives of hydrolyzed cellulose esters in which case two or more azide groups can be adjoined to a single recurring polymeric unit of the cellulosic chain. Similarly more than one azide group can be attached to Z as in the case of a diazidophenyl group.

The inherently light-sensitive alkali soluble azide polymers particularly efficacious for use in the processes of the invention contain recurring units of the formula

in which R is a bivalent aromatic radical of the benzene series whose free valences do not necessarily belong to the aromatic nucleus, for example, phenylene, $$—C_6H_4—CH_2—O—CO,\quad —C_6H_4—CO—O—,$$
$$—C_6H_4—O—,\quad C_6H_3(COOH)—CO—O—$$

and $—C_6H_4—O—C_2H_4—O—$. In some cases the acid group of the inherently light-sensitive alkali soluble azide polymer, such as a carboxyl group, is not attached to the recurring polymeric unit containing the azide group, but may be present on some other recurring unit of the polymer, for example, as in the case of the maleic acid-azidostyrene copolymer described hereinafter. In the vinyl azidophthalate copolymers described hereinafter, the carboxyl group is attached directly to the aromatic nucleus bearing the azide group.

Representative inherently light-sensitive azide polymers useful in our invention include those containing the following recurring polymeric units:

I.

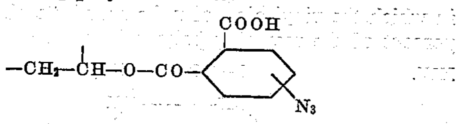

II.

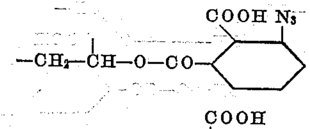

III.

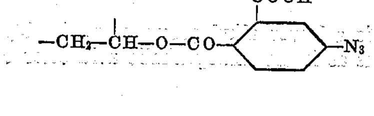

IV.

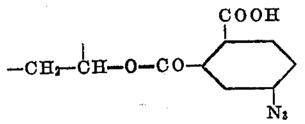

V.

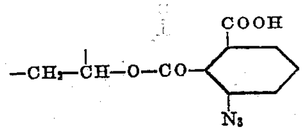

VI.

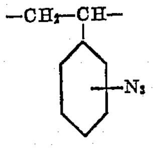

VII.

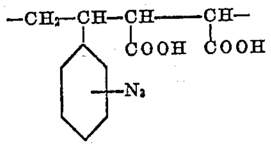

VIII.

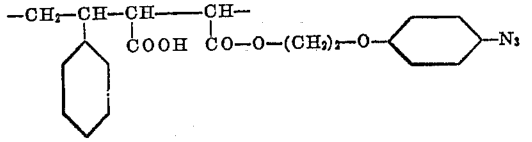

IX.

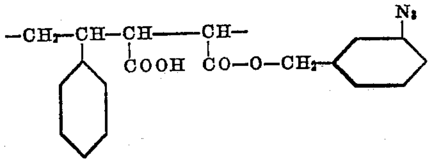

X.

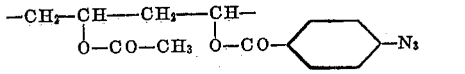

In this polymer X the azide units may constitute as little as 5 percent and as high as 90 to 100 percent of the recurring units of the polymer chain.

XI.

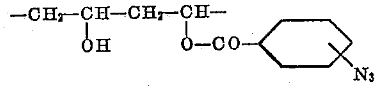

The vinyl alcohol units of this polymer may constitute from 0 to about 90 to 95 percent of the recurring units of the polymer chain.

XII.

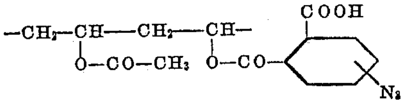

in which the vinyl acetate units constitute 0 to about 80–90 percent of the recurring polymeric units.

XIII.

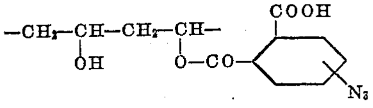

in which the vinyl alcohol units constitute about 5 to 95 percent of the recurring polymeric units.

XIV.

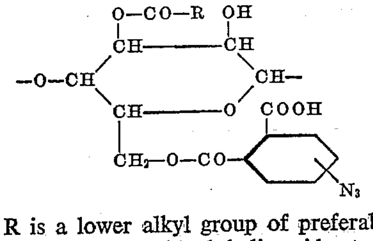

in which R is a lower alkyl group of preferably 1 to 4 carbon atoms as in an azidophthalic acid ester of a partially hydrolyzed cellulose acetate which contained about 16 to 35 percent acetyl. Hydroxyl groups of the cellulose nucleus may also be esterified with organic acids such as acetic and the azidobenzoic and azidophthalic acids.

XV. Azido phthalamides of amino containing proteins and polymers such as the 3-azidophthalamide of gelatin.

XVI. $-CH_2-CH(-CO-N_3)-$

XVII.

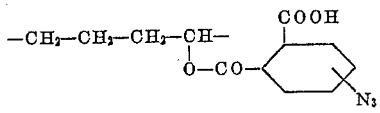

in which the vinyl azidophthalate units constitute from about 5 to 80 percent or more of the recurring units of the polymer.

XVIII. $-CH_2-CH(-O-CO-CH_2-N_3)-$

As mentioned, the preferred processes of our invention utilize inherently light-sensitive alkali-soluble polymers containing recurring aryl azide groups. The alkali solubility of the polymers is attributable to the presence in the polymer molecules of acid groups such as carboxyl either attached to units of the polymer chain separate from the recurring aryl azide units or the carboxyl groups are attached directly to the recurring aryl azide units of the polymer chain as shown in the above formulas.

The preferred inherently light-sensitive alkali-soluble azide polymers include those containing the recurring units $$-CH_2-CH(-R-N_3)-$$

in which R is a bivalent aromatic radical of the benzene series such as indicated above and present in the Formulas I to V, VII, VIII, IX, XII, XIII and XVII.

As described in the Merrill and Unruh U.S. patent application Serial No. 525,368, filed July 29, 1955, polymers containing the structural units I–IV, XI, XIII can be obtained by either fully acylating polyvinyl alcohol with the selected azidophthalic or azidobenzoic acid anhydride or by the partial acylation of polyvinyl alcohol with the selected azidophthalic or azidobenzoic acid anhydride. The most useful polymers obtained by the acylation of polyvinyl alcohol with the azidophthalic anhydrides are those containing more than about 5 mol percent of recurring vinyl azidophthalate units since the light-sensitivity of the more fully acylated polymers is greater. Vinyl azidobenzoate and vinyl azidophthalate homopolymers may also be prepared by the polymerization of the indicated vinyl azidobenzoate and phthalate monomers. Useful copolymers can also be prepared by copolymerizing other compounds containing the polymerizable $CH_2=C<$ group with the vinyl azidophthalates and vinyl azidobenzoates, e.g., acrylic and α-alkylacrylic acids, esters and amides; vinyl- and isopropenyl-ketones, -esters, -carbamates; α,β-unsaturated dicarboxylic acid anhydrides, esters, and amides; isobutylene ethylene and 1,3-butadiene. In place of vinyl azidostyrene units, vinyl azidotoluene units may be present in the polymers.

The azidostyrene-maleic anhydride and azidophthalate-maleic anhydride copolymers may be reacted with hydroxyl and amino containing compounds, including hydroxylated aromatic azide compounds, thereby greatly increasing the azide content of the polymer molecule.

Copolymers of the polymerizable azide compounds with other anhydrides such as citraconic, mesaconic and itaconic anhydrides are also useful.

The aromatic azide esters of polyvinyl alcohol (XI) include e.g. the o-, m- and p-azidobenzoates, azidochlorobenzoates, azidomethylbenzoates, azidomethoxybenzoates, azidophenylacetates, azidocinnamates, and azidonaphthoates of polyvinyl alcohol.

Polymers similar to VIII and IX above may be made by reaction of maleic anhydride-vinyl acetate, -isopropenyl acetate, -vinyl toluene and -vinyl ether copolymers with hydroxyl-containing aromatic azides such as azidobenzyl alcohol and azidophenoxyethanol. Polyacrylic and polymethacrylic anhydride polymers can be reacted similarly. Likewise, 2-(azidophenyl)ethanol, 2-azidoethanol and 2-azido-2-phenylethanol can be reacted with the anhydride polymers. Particularly useful inherently light-sensitive alkali-soluble copolymers indicated above in Formula XII are obtained by the acylation of partially hydrolyzed polyvinyl esters such as polyvinyl acetate, propionate, stearate, butyrate, cinnamate, cyanoacetate and azidobenzoate with the azidophthalic anhydrides such as 3-azido phthalic acid anhydride. The hydrolyzed polyvinyl ester thus used may contain little or no residual acetyl groups (as in the case of polyvinyl alcohol) or as much as 80 to 90 mol percent of recurring vinyl ester groups. Upon esterification of such hydrolyzed vinyl esters with the azidophthalic acid anhydrides, there are thus obtained polymers containing from about 10 to 100 mol percent of vinyl azido phthalate units, the remaining polymeric units being vinyl ester units, or vinyl alcohol units in the case vinyl alcohol was used in the synthesis.

In addition to the azidophthalic and azidobenzoic acid esters of polyvinyl alcohol, other azido phthalic and azido benzoic acid esters and amides of hydroxyl or amino-containing polymeric materials can be used in the processes of our invention, for example, azido phthalic acid esters of partially hydrolyzed cellulose organic acid esters (Formula XIV above) or similar esters of a hydrolyzed ethylene-vinyl acetate copolymer (Formula XVII). Such esters are obtained, for example, by esterifying cellulose acetate hydrolyzed to the extent that it contains about 16 to 35 percent acetyl, cellulose, starch, guar, hydroxylalkyl celluloses, or alginic acid, with the selected azido phthalic acid anhydride. Similarly, amino-containing polymers such as polyvinyl amine, polyvinyl anthranilate and proteins such as gelatin, can be reacted with azidobenzoyl chlorides to obtain the azidobenzamide polymers.

Other aromatic azido acid anhydrides which can be reacted with the hydroxyl and amino-containing polymers are diazidophthalic, chloro- and bromoazidophthalic, dichloroazido phthalic and azidonaphthalic anhydrides.

The efficacious inherently light-sensitive alkali-soluble polymers include, as mentioned, those polymers containing aryl azide groups and which may be represented as containing recurring units of the general formula

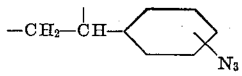

as well as containing other recurring units such as maleic acid, acrylic acid and methacrylic acid units. A typical polymer of this group, Formula VII above, is obtained by diazotization of a 4-aminostyrene-maleic acid copolymer followed by reaction with sodium azide, as described in the above patent application. Other amino-containing polymers can be diazotized similarly and reacted with sodium azide to obtain the corresponding azide polymer such as aminostyrene-ethylene, isobutylene, 1,3-butadiene copolymers; $\alpha,\beta$-unsaturated dicarboxylic acid ester, amide and imide-aminostyrene copolymers; aminostyrene-, acrylic and alkylacrylic acid ester and amide copolymers; aminostyrenevinyl and isopropenyl ketone copolymers. A ternary polymer of this type may be obtained in various ways, for example, by incomplete reaction of the maleic acid-aminostyrene copolymer intermediate with the sodium azide.

Representative polymers containing the recurring units of Formulas I–VII and IX–XIV may be prepared as described in the above-mentioned patent application.

Polyvinyl azidoacetals are also useful in our invention, e.g. polyvinyl alcohol or partially hydrolyzed polyvinyl esters reacted with 3-azidobenzaldehyde or 4-azidobenzaldehyde as described in the above Merrill and Unruh invention. Unreacted hydroxyl groups can then be acylated with acid chlorides or anhydrides, or carbamylated with isocyanates to introduce other desirable properties into the polymers. Thus, a partial polyvinyl azidobenzal acetal can be acylated with acetic, maleic, succinic, phthalic, benzoic and cinnamic acid anhydrides or acid halides.

Other aliphatic azide polymers (XVIII) are also useful such as obtained by reaction of polyvinyl chloroacetate with sodium azide in aqueous dioxane solution as described in the above Merrill and Unruh invention. These polymers can be used in the manner of the following examples hereinafter using organic solvents such as acetone for coating and developing exposed layers of the polymers.

Polymers containing recurring units of Formula VIII above can be prepared as follows:

$\beta$-(4-AZIDOPHENOXY)ETHANOL $\beta$-(4-nitrophenoxy)ethanol was prepared from sodium p-nitrophenate and ethylene chlorohydrin, and was hydrogenated in the presence of platinum oxide. The $\beta$-(4-aminophenoxy)ethanol (15.0 g., 0.098 mole) was dissolved in a solution of 30 ml. of concentrated hydrochloric acid in 150 ml. of water. The amine was diazotized at 0–5° with 7.0 g. (0.10 mole) of sodium nitrite in 30 ml. of water. Then a solution of 7.5 g. (0.11 mole) of sodium azide in 30 ml. of water was added (hood) in portions while keeping the temperature below 10°. The evolution of nitrogen caused considerable foaming. The precipitate which formed was allowed to stand for several hours at room temperature, then it was collected, washed with water, and vacuum dried. The yield of $\beta$-(4-azidophenoxy)ethanol, M.P. 37–38, was 15 g. (85 percent).

Calculated for $C_8H_9O_2N_3$: N, 23.5. Found: N, 22.7.

ESTERIFICATION OF STYRENE-MALEIC ANHYDRIDE HETEROPOLYMER WITH $\beta$-(4-AZIDOPHENOXY)ETHANOL To a solution of 13.0 g. (0.064 mole) of a 1 to 1 styrene-maleic anhydride heteropolymer in 130 ml. of dry pyridine at 70° was added 10.0 g. (0.056 mole) of $\beta$-(4-azidophenoxy)ethanol. The mixture was maintained at 70° for four hours and allowed to stand overnight at room temperature.

After dilution with 50 ml. of acetone, the polymer was precipitated in two liters of ethyl ether, then reprecipitated from 250 ml. of acetone into three liters of 0.3 percent hydrochloric acid. After washing in water, the product (12 g.) was dried at 40°. It was soluble in dilute aqueous ammonia containing a small amount of ethanol.

Calculated for 100 percent reaction: N, 10.2. Found: N, 7.5.

The azido gelatin polymer XV is prepared as follows:

Ten grams of gelatin was dissolved in 110 ml. of water and stirred at 50 while 5 g. of 3-azidophthalic anhydride was added in small portions along with sufficient 10 percent sodium hydroxide to maintain the pH at 8–10. The heating was continued for three hours, after which the solution was acidified with acetic acid to pH 6. The solution was evaporated to about 80 ml. by exposure to air, and the product (9 g.) was obtained by precipitation in acetone. This gelatin derivative was readily soluble in water. It could be precipitated by the addition of hydrochloric acid, then redissolved in alkali.

The acrylazide polymer XVI can be obtained by the polymerization of acrylazide (German Patent 860,636).

The ethylene-azide polymer XVII can be prepared as follows:

To a solution of 5.0 g. of ethylene-vinyl alcohol copolymer (66.7 mole percent vinyl alcohol) in 75 ml. of dry pyridine was added an equivalent amount (16.3 g., 0.086 mole) of the mixed isomers of azidophthalic anhydride. The mixture was heated at 55° for four hours and allowed to stand overnight at room temperature.

After filtration, the polymer was precipitated in four liters of one percent hydrochloric acid followed by a fresh water wash and vacuum drying at room temperature. The product (14 g.) was soluble in acetone, dioxane, and dilute aqueous alkali.

Calculated for 100 percent reaction: N, 18.8. Found: N, 17.2.

The process of using the azide polymers according to our invention is illustrated in the accompanying drawing wherein in stage 1 is shown an element having a support 10 such as a metal plate on which has been coated a layer 11 of azide polymer, being exposed to an original so as to insolubilize area 12 of layer 11. Then, as described in stage 2 of the drawing, upon development with water, alkali or solvent, depending upon the particular process under consideration, the unexposed polymer in areas 13 of layer 11 is dissolved away, in some cases baring the support in areas 13 (Example 5). In other cases when another polymer was initially present together with the azide polymer (Example 2), development results in layer 11 becoming differentially permeable, for example, to alkali, as will be explained in more detail hereinafter. In a similar process, when a suitable support 10 has been used and rubber latex is present in the original light-sensitive layer containing the azide polymer, development produces a direct positive element in which the exposed areas of layer 11 are removed.

Representative processes of our invention in which the above light-sensitive azide polymers can be used are provided in the following examples:

*Example 1*

An aqueous solution of the ammonium salt of the vinyl acetate-vinyl-3-azidophthalate polymer (Formula XII) containing about 53 mole percent of vinyl acetate units, prepared as described in the above-mentioned patent application, was mixed with a natural rubber latex and after addition of dispersing agent was coated on a metal plate on which had been coated a layer of asphalt. The sensitive layer was dried, exposed under a line positive to a 90-ampere carbon arc for 30 seconds at 30 inches distance, immersed in hot water 130–140° F. momentarily, then sprayed with cold water. The exposed areas of the layer readily washed off while the unexposed areas adhered to the asphalt layer. The resist image thus obtained on the plate was found to be useful as a sandblast resist.

*Example 2*

A lithographic printing plate was prepared by coating on a cellulose acetate film support a layer of an aqueous mixture of a water-soluble salt of the polymer of Example 1 and an aqueous colloidal dispersion of a 25 percent acrylonitrile-75 percent ethyl acrylate copolymer. The element was exposed under a line positive to insolubilize the azide polymer in the region of exposure and following this, the plate was treated with hot water to dissolve the azide polymer in the unexposed regions and cause coalescence of the other polymers in that area. During this treatment, the exposed areas of the layer swelled, and it was possible to superficially hydrolyze the support through these swollen areas using alcoholic sodium hydroxide solution. The whole polymer layer was then removed from the support, leaving a cellulosic surface the superficially hydrolyzed areas of which repelled ink when the element was used in a conventional lithographic press for printing. The other alkali-soluble azide polymers mentioned above can be used in a similar manner. Also other aqueous colloidal dispersions of acrylate polymers can be used in the processes of Examples 1 and 2 in a similar manner, for example, aqueous colloidal dispersions of a water-insoluble, soft acrylate resin such as polymethyl acrylate, polyethyl acrylate, methyl acrylate-ethyl acrylate copolymers, methyl acrylate-acrylonitrile copolymers, ethyl acrylate-acrylonitrile copolymers, mixtures of said polymers and copolymers, and mixtures of ethyl acrylate-acrylonitrile copolymers and polystyrene aqueous dispersions.

*Example 3*

A colorproofing process was carried out by dispersing three grams of the azide polymer of Example 1 in 100 cc. of a water-acetone solution (70 parts of water and 30 parts of acetone) containing 1.5 grams of sodium carbonate. The solution was divided into two parts and five grams of Monastral Fast Blue WD were milled into one of the solutions and two grams of Fanchon Yellow were milled into the other solution. Each composition was then coated onto a cellulose acetate support, exposed through the support to a halftone color-separation negative, followed by washing out the pigmented polymer areas of the layer which had not become insolubilized upon exposure to light. The colored positives thus obtained were superimposed to obtain a two-color proof.

*Example 4*

A lithographic printing plate was prepared by coating a casein-surfaced paper with a solution of 15 cc. of a seven percent solution of the polymer of Example 1 dissolved in dilute ammonium hydroxide (90 cc. water, 10 cc. 28% ammonium hydroxide), 10 cc. of water, 15 cc. of a 50 percent aqueous dispersion of a 40 percent acrylonitrile-60 percent ethyl acrylate copolymer and 5 cc. of a 20 percent aqueous suspension of Monastral Fast Blue WD. After drying, the sensitive layer of pigmented azide polymer was exposed under a line negative to a 90-ampere carbon arc for one minute, after which the layer was swabbed with a solution of 50 cc. methyl Cellosolve acetate, 50 cc. water and 5 cc. of 28 percent ammonium hydroxide solution using a velvet pad. The unexposed areas readily came off the support, leaving a tough ink-receptive image thereon. The element printed well on a lithographic press, particularly when a dilute acid fountain solution was used to increase the hydrophobic character of the resist image. In a similar manner, other hydrophilic supports can be coated with light-sensitive compositions containing the inherently light-sensitive alkali-soluble azide polymers of the invention either in the form of water-soluble salts or from solvents in the case of the acid form of the azide polymers. In the latter case, after exposure of layers containing the acid form of the azide polymer, the unexposed areas can be removed from the support using either alkaline solutions or an organic solvent.

*Example 5*

A "deep etch" lithographic printing plate was prepared as follows:

Ten grams of polyvinyl hydrogen phthalate and 10 grams of the vinyl acetate-3-azidiphthalate copolymer of Example 1 were dissolved in 200 cc. of water containing 20 cc. of 28 percent ammonium hydroxide. This composition was coated on aluminum which had been given a fine tooth by "sand" blasting using 325-mesh aluminum oxide. The coating was dried, exposed under a line positive, unexposed areas washed out with a spray of cold water and immersed in a dilute acetic acid rinse, then dried. The exposed metal was then lightly etched with a hydrochloric-phosphoric acid solution highly "salted" with calcium chloride to suppress swelling in the resist areas. The etching solution was washed off, the plate dried and then coated uniformly with a thin film of "deep etch lacquer." Swabbing the plate with dilute ammonia removes lacquer and the underlying resist from the nonimage areas without disturbing the lacquer where it is in direct contact with the metal. Treatment of the plate with dilute phosphoric acid renders the bare aluminum water-receptive while the ink is carried by the lacquer image.

*Example 6*

A lithographic plate was prepared as follows:

A solution of 7.5 grams of the azide polymer of Example 1 in one liter of 0.5 percent ammonium hydroxide solution was coated on a damp paper which previously had been coated with a thin layer of polyvinyl alcohol. After exposure under a line and halftone negative to a 35-ampere carbon arc for 45 seconds to 1½ minutes, the paper was swabbed with a cotton swab wetted with a solution of five grams of sodium carbonate in one liter of water. The element was then treated with a desensitizing etch solution and then printed on a lithographic printing press.

*Example 7*

A lithographic printing plate was prepared as follows: A grained aluminum plate was coated with an aqueous mixture of five percent polyvinyl alcohol, three percent potassium nitrate (based on the weight of polymer present) and two percent of β-methylglutaraldehyde hardening agent. The resulting plate was then sensitized with the azide polymer solution of Example 6 and processed in the same manner to obtain a satisfactory lithographic printing plate.

*Example 8*

A sheet of superficially hydrolyzed cellulose acetate was sensitized with the azide polymer composition of Example 6 followed by exposure and development with carbonate solution as in Example 6, followed by swabbing the resulting plate with dilute phosphoric acid solution to improve the inking properties of the plate on a lithographic printing press.

*Example 9*

Light-sensitive compositions similar to that of Example 4 containing a mixture of one of the inherently light-sensitive alkali-soluble azide polymers mentioned above and an acrylate polymer dispersion can be used to obtain colored photographic images. For example, a 5 cc. portion of a solution of seven grams of a vinyl acetate-vinyl-3(4)-azido-phthalate polymer (obtained by the esterification of partially hydrolyzed vinyl acetate with a mixture of 3- and 4-azidophthalic acid anhydrides) in a solution of 10 cc. of 28 percent ammonium hydroxide and 90 cc. of water was mixed with 10 cc. of a 50 percent aqueous dispersion of a 25 percent acrylonitrile-75 percent ethyl acrylate copolymer and 10 cc. of dispersing agent was coated onto a thin cellulose acetate sheet. After exposure under a continuous-tone negative, the sheet was bathed for 15 minutes in a 1 percent ammonium hydroxide solution, rinsed and dyed with a 0.05 percent aqueous solution of Rhodamine B ExS(GDC). It was found that the dye took only in the exposed areas of the sheet, partly because the unexposed azide polymer in the other areas had been removed in the washing step. Other colored images can be prepared in a similar manner employing the usual color-separation negatives of color photography and dyeing the resulting polymeric images subtractively followed by superimposing them to obtain a subtractively colored reproduction of the original subject. Other dispersions of acrylate polymers, such as those mentioned above, can be incorporated with the alkali-soluble azide polymers for preparing colored images of this process.

*Example 10*

In the preparation of other printing plates, the azide polymers containing no alkali-solubilizing group such as the polyazido-styrene polymer of Formula VI above, prepared as described in the above-mentioned patent application, can be coated from organic solvents such as benzene and xylene onto various supports such as grained zinc and aluminum, surface-hydrolyzed cellulose esters, polyvinyl alcohol-coated paper, casein-coated paper, and the like and after exposure of the layer under an original, the unexposed areas can be removed from the base with a suitable solvent to produce a lithographic printing plate. Other supports such as copper, zinc, aluminum and magnesium not having a hydrophilic surface can be coated with layers of the above azide polymers and after formation of resist images thereon in the manner described in the above examples, the plates may be etched by processes well known in the photomechanical art.

*Example 11*

Electrically conducting images on insulating supports (printed circuits) can be prepared as follows: A lightly sandblasting insulating support was coated with a composition containing 30 grams of silver bromide dispersed by milling in 50 cc. of a solution of three grams of the azide polymer of Example 1, 1.5 grams of sodium carbonate monohydrate in a mixture of 30 cc. of acetone and 70 cc. of water. The dried plate was then exposed through a negative to a 90-ampere carbon arc for 90 seconds after which the image was "developed" with a gentle spray of cold water, the unexposed areas of the plate being removed thereby. The resulting insoluble relief image was washed with several portions of a solution of sodium stannite until the silver bromide in the image had been completely reduced and the image thereby thoroughly blackened. If desired, the image can be intensified by treatment with a solution containing 50 grams of mercuric bromide, 50 grams potassium bromide in one liter of water, followed by treatment with a solution of 50 grams silver nitrate, 8 grams mercurous nitrate, 35 grams potassium nitrate in one liter of water. The image is then treated with a conventional Elon-hydroquinone silver halide developing solution. The image can then be electroplated using a solution of 190 grams of copper sulfate, 45 grams sulfuric acid in one liter of water. Other azide polymers of the invention can be used in the original light-sensitive composition together with other reducible metal salts and processing can be carried out using water, alkaline solutions, or organic solvents, depending on the exact nature of the azide polymer employed. An interesting application of the process resides in the fact that in the preparation of printed resistances on insulating supports, it is possible to "stage out" any desired portions of the image at any stage in the process using an impermeable lacquer, thereby producing differing resistances in the final product. In this procedure, after the original exposure and "development" steps to form the insoluble relief, the silver halide may be reduced to silver with a conventional photographic developer to obtain low electrical resistances, or the stannite reduction may be followed by a ferricyanide-bromide bleach and again reducing with stannite to obtain higher resistances.

If desired the above procedures can be carried out by initially coating the light-sensitive compositions of a mixture of silver halide and azide polymer, upon long rolls of a support material such as cellulose acetate film base and the electrically conducting images can be prepared thereon in a continuous or stepwise process using the exposure, relief development, silver halide reduction and if desired intensification steps mentioned. If desired the resultant electrically conducting image can be left on the support, alternatively the sensitive emulsion can be coated upon a support provided with a stripping layer to facilitate transfer of the electrically conducting images to a permanent support such as an insulating panel of an electrical or electronic device.

*Example 12*

The coating solution for the following examples was prepared as follows:

| | | |
|---|---|---|
| Polymer Formula XII | g. | 2 |
| Sensitizer No. 11 | g. | 0.06 |
| 2-methoxyethylacetate | cc. | 100 |

This was applied to various dry supports by coating on a whirler at 80 r.p.m. until the coating dried by solvent evaporation. The coatings were exposed 3 feet from a 35-amp. carbon arc and in contact with suitable line or halftone transparencies.

A sheet of photoengraver's copper or copper-clad phenolic laminate is scrubbed with pumice and water, dipped for 15 seconds in 5% hydrochloric acid solution, rinsed, and dried. The dry support is coated and exposed. Development for 30 seconds in a trichloroethylene vapor-degreaser dissolves away the unexposed portions of coating leaving a resist image on the surface of the support. The support is treated in 42° Bé. ferric chloride solution to dissolve the copper in the non-image areas to give either a photoengraving or a printed circuit.

*Example 13*

A sheet of photoengraver's zinc or magnesium is scrubbed with pumice and water, dipped in 2% phosphoric acid solution for 30 seconds in the case of magnesium or 2 minutes for zinc, rinsed and dried. The dry support is coated and exposed for 1 minute. The unexposed portions of coating are dissolved by immersing the plate for two minutes in a tank or tray of 2-methoxyethylacetate. The exposed image portions of the coating may be dyed. Excess developer or dye bath is flushed from the plate with a strong stream of water and the plate is dried. The plate is treated in 6–12% nitric acid solution to etch the exposed image into relief by dissolving away the unprotected metal. The result is either a zinc or magnesium photoengraving.

*Example 14*

A sheet of lithographer's grained zinc is counteretched in 1% hydrochloric acid, rinsed, and dried. Two volumes of the coating solution are diluted with one volume of 2-methoxyethylacetate which contains 0.2% by volume of triethanolamine. The mixture is coated and exposed for 30 seconds. Development for 30 seconds in a vapor degreaser dissolves away the unexposed portions of coating leaving an ink-receptive image on the zinc support. The zinc areas are made water-receptive with a conventional litho etch and a conventional litho developing ink is applied to the polymer image to provide a lithographic printing plate.

The following examples illustrate the use of the azide polymers, particularly of the alkali soluble variety in the preparation of phototemplates for the fabrication of mechanical parts.

*Example 15*

Two grams of polyvinylacetate-3-azidophthalate and 0.4 gm. sodium carbonate monohydrate were dissolved in a solvent mixture of 30 ml. water and 70 ml. denatured alcohol. After the polymer was dissolved, 4 gm. Titanox Pigment were added to the solution and milled for 18 hours. This mixture was spray-coated onto a silicated aluminum sheet and allowed to dry. After an exposure through a line photographic positive in a vacuum frame for 1–4 minutes at 3 feet from a MacBeth 35-amp. White Flame Carbon Arc, the exposed plate was placed face up in a tray of water at room temperature. In approximately 30 seconds, the exposed areas of the coating lifted from the support leaving behind a direct positive Titanox image on the aluminum surface. At this stage, the image is very fragile, but dipping or spraying the plate with a dilute (3%) sodium silicate solution and allowing the solution to dry, toughens the image so it can withstand normal handling. The Titanox phototemplate image also is sufficiently heat resistant that it provides a satisfactory guide for cutting aluminum with a torch.

*Example 16*

The pigmented solution described in Example 15 was spray-coated onto aluminum which had been previously swabbed with dilute ferric chloride solution, rinsed well and dried. After drying, the coating was exposed through a line photographic positive in a vacuum frame for 1½ minutes at 3 feet from a MacBeth White Flame Carbon Arc. The exposed plate was placed face up in a tray of water at room temperature for 30 seconds and was then removed and sprayed with a stream of water. The unexposed portion of the coating washed off leaving a negative Titanox image adhering to the aluminum surface.

*Example 17*

One- and one-third grams of polyvinylacetate-3-azidophthalate, 0.27 gm. sodium carbonate monohydrate and 0.4 gm. Methyl Violet Dye were dissolved in a solvent mixture of 30 ml. water and 70 ml. isopropyl alcohol. The solution was spray-coated on an aluminum sheet which had been previously degreased in trichloroethylene, scrubbed with a pumice cleaner, rinsed thoroughly and dried. After drying the coating, the sheet was exposed through a pencil drawing on tracing paper for 1½ minutes at 3 feet from a MacBeth White Flame Carbon Arc. The coating was washed under a stream of tap water to remove the unexposed coating leaving a violet-dyed negative template image on the aluminum sheet.

*Example 18*

The dyed solution described in Example 17 was spray-coated on a white enameled steel sheet. The coating was exposed and processed as in Example 17. A phototemplate prepared in this manner can be used as a dimensionally stable, permanent record of an engineering drawing.

*Example 19*

Two grams of polyvinylacetate-3-azidophthalate, 0.4 gm. sodium carbonate monohydrate and 0.4 gm. Methyl Violet Dye were dissolved in a solvent mixture of 30 ml. water and 70 ml. denatured alcohol. The above solution was whirl coated at 80 r.p.m. onto a clean aluminum surface. After exposure through a line photographic positive, the plate was placed face up in a tray of water at room temperature and was rocked until the unexposed coating dissolved leaving a violet-dyed negative image adhering to the aluminum plate.

The other inherently light-sensitive alkali-soluble azide polymers noted above can be used in the manner of the preceding examples to obtain lithographic printing plates on hydrophilic surfaces. For this purpose, grained zinc and aluminum plates, surface-hydrolyzed cellulose esters coated on aluminum plates or surface-hydrolyzed cellulose esters coated on paper stocks are satisfactory for use with the azide polymers.

The light sensitivity of the azide polymers described above can be increased by the incorporation of certain sensitizing agents into coatings of the polymers. For example, the following compounds have been found to greatly increase the light sensitivity of the polymers particularly of the vinyl acetate-vinyl azidophthalate polymers.

(1) 1-ethyl-2-($\beta$-styryl)quinolinium iodide
(2) 2-(3-sulfobenzoylmethylene)-1-methyl-$\beta$-naphthothiazoline (pyridine salt)
(3) 2-(4-carboxybenzoylmethylene)-1-methyl-$\beta$-naphthothiazoline
(4) 4,4'-diazidostilbene-2,2'-disulfonic acid
(5) 1-ethyl-2(p-hydroxyethoxystyryl)quinolinium iodide
(6) Acridine Yellow
(7) Acriflavine hydrochloride
(8) p-Hydroxyethoxybenzal-p'-anisalacetone ester of styrene-maleic anhydride polymer
(9) p-Carboxyethoxy-p'-($\beta$-hydroxyethoxy)benzalacetophenone ester of styrene-maleic anhydride polymer
(10) p-Hydroxyethoxy cinnamic acid ester of styrene-maleic anhydride polymer
(11) 1-methyl-2-benzoylmethylene-$\beta$-naphthothiazoline
(12) 1-methyl-4'-hydroxyethoxystilbazolium methosulfate.

The latter compound imparts high light-sensitivity to the azidobenzoate polymers, such as the vinyl acetate-azidobenzoate polymers mentioned herein.

Compounds 1, 2, 3, 5 and 12 are particularly efficacious for use with the alkali-soluble azide polymers, such as the mentioned vinyl ester-vinyl azidophthalate and vinyl alcohol-vinyl azidophthalate copolymers (XII and XIII). In general the alkali soluble sensitizers are most useful with the alkali soluble polymers and the organic solvent soluble sensitizers with similarly soluble azide polymers.

The preparation and use of these sensitizers is illustrated as follows:

1-ETHYL-2-($\beta$-STYRYL)QUINOLINIUM IODIDE

To a solution of 5.0 g. of quinaldine ethiodide and 1.8 g. of benzaldehyde in 100 ml. of methanol was added 1 ml. of piperidine, and the dark solution was allowed to stand at room temperature for two days. Crystallization was induced by refrigeration. Recrystallization from ethanol gave 2.5 g. of green needles, M.P. 227–228° (dec.).

*Analysis.*—Calculated for $C_{19}H_{18}NI$: C, 58.9; H, 4.7. Found: C, 59.0; H, 5.

1 - ETHYL - 2 - (p - HYDROXYETHOXYSTYRYL) QUINOLINIUM IODIDE

A solution of 20 g. of quinaldine ethiodide, 16 g. of p-($\beta$-hydroxyethoxy)-benzaldehyde, and 8 ml. of piperidine in 400 ml. of methanol was heated at reflux for an hour. Several hours were allowed for crystallization, and the product was filtered and washed thoroughly with hot methanol. The yield of green-brown needles was 16 g., M.P. 255–256° (dec.).

*Analysis.*—Calculated for $C_{21}H_{22}O_2NI$: C, 56.4; H, 5.0. Found: C, 56.1; H, 4.6.

1 - METHYL-4'-HYDROXYETHOXYSTILBAZOLIUM METHOSULFATE

A solution of 103 g. of 1,2-dimethylpyridinium methosulfate, 100 g., of p-hydroxyethoxybenzaldehyde, 12 ml. of piperidine in 200 ml. of methanol was refluxed for four hours. Refrigeration yielded crystals which were then recrystallized twice from a mixture of 100 ml. of ethanol and 60 ml. of benzene. The product, 52 g., M.P. 137–138°, was bright yellow.

*Analysis.*—Calculated for $C_{17}H_{21}O_6NS$: C, 55.6; H, 5.8; S, 8.7. Found: C, 56.3; H, 6.3; S, 8.6.

Small amounts of these salts were dissolved in one-percent solutions of polyvinyl acetate azidophthalate in 0.5 percent ammonium hydroxide. These solutions were coated on grained aluminum and the dried coatings exposed through a negative followed by development in 0.5 percent ammonium hydroxide.

1 - METHYL-2-(3-SULFOBENZOYLMETHYLENE)-$\beta$-NAPHTHOTHIAZOLINE PYRIDINE SALT

To a thick paste of 115.5 g. (0.3 mole) of 2-methyl-$\beta$-naphthothiazole metho-p-toluenesulfonate in 270 ml. of anhydrous pyridine cooled in an ice bath was added 82.7 g. (0.375 mole) of m-chlorosulfonylbenzoic acid portionwise and with stirring in approximately 20 minutes. The mixture was stirred for approximately one-half hour at room temperature and then with heating on a steam bath for 20 minutes.

Slow crystallization occurred after the addition of 600 ml. of ethyl alcohol. Two crops gave a yield of 51 g. (43 percent). Recrystallization from a mixture of pyridine and methanol gave a product with an M.P. of 236.5–239.5°. The product is readily soluble in dilute alkaline solutions. An analytical sample melted at 240–241° and gave the following analysis:

Calc'd: C, 63.0; H, 4.2; N, 5.9; S, 13.4. Found: C, 63.0; H, 4.2; N, 5.9; S, 13.1.

2-(4-CARBOXYBENZOYLMETHYLENE)-1-METHYL-$\beta$-NAPHTHOTHIAZOLINE

A mixture of 19.25 g. (0.05 mole) of 2-methyl-$\beta$-naphthothiazole metho-p-toluenesulfonate and 45 ml. of pyridine was cooled in an ice bath. Then, 13.3 g. (0.0625 mole) of p-carbethoxybenzoyl chloride was added portionwise with stirring. The mixture was stirred at room temperature for 20 minutes and finally heated on a steam bath for 15 minutes. Solution occurred and then the product crystallized out. After cooling, the solid was collected, washed thoroughly with methanol, and dried. The yield of 2-(4-carbethoxybenzoylmethylene)-1-methyl-$\beta$-naphthothiazoline was 14.7 g. (75.5 percent), M.P. 242–244°.

An analytical sample crystallized from methyl Cellosolve had a M.P. of 244–244.5° and gave the following analysis:

Calc'd.: C, 71.0; H, 4.9; N, 3.6; S, 8.2. Found: C, 70.8; H, 4.6; N, 3.5; S, 9.0.

This carbethoxy intermediate was hydrolyzed to the free acid by refluxing 10 g. in 50 ml. of methyl Cellosolve and adding 16.25 g. (one equivalent) of aqueous 40 percent solution of trimethylbenzylammonium hydroxide dropwise. After addition was complete, the mixture was refluxed for an additional 15 minutes. Addition of 800 ml. of water threw out a finely divided solid. The mixture was acidified with dilute hydrochloric acid, and then the solid was collected, washed with water, and dried at 50° to give an 8.2 g. (88 percent) yield, M.P. 308–310°.

Recrystallization from pyridine gave an M.P. of 310–312°, and the following analysis:

Calc'd.: C, 69.8; H, 4.2; N, 3.9; S, 8.9. Found: C, 69.5; H, 4.0; N, 3.7; S, 9.0.

When these sensitizers were used with the vinyl azidophthalate in particular the light-sensitivity of the polymers was increased approximately 3 times.

Polyvinyl toluene is an example of a polymer which can also be sensitized to increase its light-sensitivity using, for example, 1,4-naphthoquinone, Michler's ketone, phenanthraquinone, benzoquinone, or 4,4'-diazidodiphenyl. The sensitized polymer is not, however, as light-sensitive as the polymers of the invention but can be used with good results in the processes of the examples herein.

The light-sensitive azide polymers of the invention have light sensitivities of the order of diazo compounds but when the azide polymers are sensitized with compounds such as noted above, the light sensitivity is increased to as much as eight times the light sensitivity of diazo compounds. It will be appreciated that the term "light sensitivity" as used herein denotes the capacity of an azide polymer of the invention to be insolubilized upon exposure to light. The light sensitivities are obtained in a manner simulating actual use of the polymer in photomechanical processes by exposure of a layer of the polymer under a step tablet followed by development with alkali, water or organic solvent, as the case may be, and assigning a speed factor to the polymer on the basis of the number of steps of the step tablet that have been reproduced in the polymer layer.

What we claim is:

1. A photographic reproduction process which comprises exposing to an original a supported layer of an inherently light-sensitive film forming polymer containing from about 10 to 100 percent of recurring units having the formula:

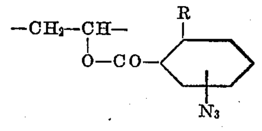

wherein R represents a member of the class consisting of a hydrogen atom and a carboxyl group any remaining recurring units of the polymer being selected from the class consisting of vinyl alcohol and vinyl ester units, until the exposed regions of the layer become insoluble, dissolving only the polymer in the unexposed regions of the layer, and leaving an image of insoluble polymer remaining on the support.

2. A photographic reproduction process which comprises exposing to an original a supported layer of an inherently light-sensitive film forming polymer containing from about 10 to 100 percent of recurring units having the formula:

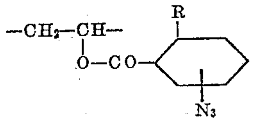

wherein R represents a member of the class consisting of a hydrogen atom and a carboxyl group, any remaining recurring units of the polymer being vinyl ester units, until the exposed regions of the layer become insoluble, dissolving only the polymer in the unexposed regions of the layer, and leaving an image of insoluble polymer remaining on the support.

3. A photographic reproduction process which comprises exposing to an original a supported layer of an inherently light-sensitive film forming polymer containing from about 10 to 100 percent of recurring units having the formula:

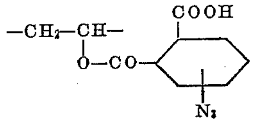

any remaining recurring units of the polymer being vinyl acetate units, until the exposed regions of the layer become insoluble, dissolving only the polymer in the unexposed regions of the layer, and leaving an image of insoluble polymer remaining on the support.

4. A photographic reproduction process which comprises exposing to an original a supported layer of an inherently light-sensitive film forming polymer containing from about 10 to 100 percent of recurring units having the formula:

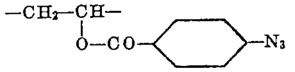

any remaining recurring units of the polymer being vinyl acetate units, until the exposed regions of the layer become insoluble, dissolving only the polymer in the unexposed regions of the layer, and leaving an image of insoluble polymer remaining on the support.

5. A photographic reproduction process which comprises exposing to an original a supported layer of an inherently light-sensitive film forming polymer containing from about 10 to 100 percent of recurring units having the formula:

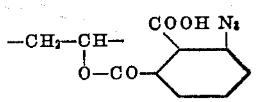

any remaining recurring units of the polymer being vinyl acetate units, until the exposed regions of the layer become insoluble, dissolving only the polymer in the unexposed regions of the layer, and leaving an image of insoluble polymer remaining on the support.

6. A light-sensitive composition comprising a mixture of an inherently light-sensitive film forming polymer containing from about 10 to 100 percent of recurring units having the formula:

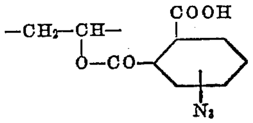

any remaining recurring units of the polymer being vinyl acetate units, and as a light sensitizing agent for the polymer a member of the class consisting of 1-ethyl-2-(β-styryl)quinolinium iodide
2-(3-sulfobenzoylmethylene)-1-methyl-β-naphthothiazoline(pyridine salt)
2-(4-carboxybenzoylmethylene)-1-methyl-β-naphthothiazoline
1-ethyl-2(p-hydroxystyryl)quinolinium iodide and
1-methyl-4'-hydroxyethoxystilbazolium methosulfate.

References Cited in the file of this patent

UNITED STATES PATENTS

| | | |
|---|---|---|
| 2,498,722 | Straley | Feb. 28, 1950 |
| 2,551,133 | Jennings et al. | May 1, 1951 |
| 2,663,640 | Reichel et al. | Dec. 22, 1953 |
| 2,692,826 | Neugebauer et al. | Oct. 26, 1954 |
| 2,695,846 | Mally | Nov. 30, 1954 |
| 2,714,066 | Jewett et al. | July 26, 1955 |